United States Patent [19]

Joyner et al.

[11] Patent Number: 5,429,955
[45] Date of Patent: Jul. 4, 1995

[54] METHOD FOR CONSTRUCTING SEMICONDUCTOR-ON-INSULATOR

[75] Inventors: Keith A. Joyner, Richardson; Mohamed K. El-Ghor, Plano; Harold H. Hosack, Dallas, all of Tex.

[73] Assignee: Texas Instruments Incorporated, Dallas, Tex.

[21] Appl. No.: 966,236

[22] Filed: Oct. 26, 1992

[51] Int. Cl.⁶ .......................................... H01L 21/265
[52] U.S. Cl. ........................................ 437/26; 437/28; 204/192.37
[58] Field of Search ............................ 437/24, 28, 26; 204/192.35, 192.37

[56] References Cited

U.S. PATENT DOCUMENTS

| | | | |
|---|---|---|---|
| 4,704,302 | 11/1987 | Bruel et al. | 437/240 |
| 4,749,660 | 6/1988 | Short et al. | 437/24 |
| 4,975,126 | 12/1990 | Margail et al. | 437/24 |
| 5,080,730 | 1/1992 | Wittkower | 437/24 |
| 5,143,858 | 9/1992 | Tomozane et al. | 437/24 |

*Primary Examiner*—Nam Nguyen
*Attorney, Agent, or Firm*—Peter T. Rutkowski; Richard L. Donaldson; William E. Hiller

[57] ABSTRACT

A method for constructing a semiconductor-on-insulator is provided. A sacrificial layer (12) of a predetermined thickness is first formed on a semiconductor wafer (10) surface. The wafer (10) is then subjected to an ion implantation process to place the ions (16) at predetermined depths below the semiconductor wafer surface. During the implantation process, the sacrificial layer (12) is gradually sputtered away and thereby compensating the gradual outgrowth of the silicon surface due to the volume of the implanted ions (16). A post-implant anneal is performed to allow the ions (16) to react with the semiconductor to form a buried insulating layer (24).

12 Claims, 1 Drawing Sheet

METHOD FOR CONSTRUCTING SEMICONDUCTOR-ON-INSULATOR

This invention was made with government support under Contract #F33615-89-C-5714 awarded by Department of the Air Force, Air Force Systems Command, Aeronautical Systems Div./PMRRC, Wright-Patterson AFB, Dayton, Ohio 45433-6503. The government has certain rights in this invention.

TECHNICAL FIELD OF THE INVENTION

This invention relates in general to the field of semiconductor fabrication, and more particularly the present invention relates to a method for constructing semiconductor-on-insulator.

BACKGROUND OF THE INVENTION

The semiconductor-on-insulator or silicon-on-insulator (SOI) technology has been recognized to have promising applications in high voltage applications, high radiation applications, and smart power applications where high current and voltage devices and low voltage and current devices are built on the same wafer. In the SOI technology devices are completely surrounded or isolated by an insulator rather than a pn junction as in conventional devices.

Current viable SOI fabrication processes include wafer bonding in which two oxidized silicon wafers are fused together. One of the outer silicon surfaces is either chemically polished, etched or mechanically lapped to a desired thickness. One disadvantage associated with wafer bonding is the limitation on the minimum thickness that can be achieved and the uniformity of that thickness across the wafer. In addition, wafer bonding is acutely susceptible to voids created at the bonding surface by the presence of particulates.

An alternative to the wafer bonding process is commonly known as SIMOX (Separation by IMplanted OXygen). In SIMOX, a buried layer of $SiO_2$ or silicon oxide is created by implanting oxygen into silicon. The technique requires a high dose of oxygen ions accelerated to high kinetic energies directed into the silicon wafer and implanted at a sufficient depth within the silicon. A subsequent anneal step allows the implanted oxygen ions to complete the reaction with the silicon to form a continuous layer of buried stoichiometric silicon oxide. As a result, a buried oxide layer lies beneath a surface silicon layer of appropriate thickness, and a bulk silicon layer lies beneath the oxide layer. However, this process creates undesirable silicon islands or inclusions in the buried oxide layer near the bulk silicon interface. The presence of silicon inclusions in the buried oxide causes a decrease in the dielectric breakdown voltage of the resultant devices. Furthermore, the silicon inclusions may also trap radiation induced carriers, which effectively decreases the radiation hardness of resultant circuits.

Two methods for eliminating undesirable silicon inclusions are known in the industry. The first method involves multiple implantation and anneal steps. Although successful, this method introduces additional fabrication cost and time into the SIMOX process. The second method involves increasing the ion implant energy. During implantation, wafer heating is normally provided by the implantation beam energy. Lower energy results in a lower wafer temperature during implantation. The normal beam energy is also the practical upper limit for production ion implantation. Because approximately 600° C. wafer temperature is required to preserve surface silicon crystallinity, the variation in implant energy directly affects the wafer quality. Therefore, additional temperature and implantation energy monitoring and compensation methods must be considered and employed.

Accordingly, it is desirable to provide an SOI method for forming a buried oxide layer in silicon that is essentially free of silicon inclusions. In addition, it is desirable that this method not require processing steps dissimilar to conventional IC manufacturing steps for cost and time considerations.

SUMMARY OF THE INVENTION

In accordance with the present invention, a method for constructing an SOI structure is provided which substantially eliminates or reduces disadvantages and problems associated with prior fabrication methods.

In one aspect of the present invention, a sacrificial layer of a predetermined thickness is first formed on a semiconductor wafer surface. The wafer is then subjected to an ion implantation process to place the ions at predetermined depths below the semiconductor wafer surface. During the implantation process, the sacrificial layer is gradually sputtered away and thereby compensating the gradual outgrowth of the silicon surface due to the volume of the implanted ions. A post-implant anneal is performed to allow the implanted ions to react with the semiconductor to form a buried insulating layer.

In another aspect of the present invention, the sacrificial layer is a silicon oxide layer of approximately 1200–1600 Å thick.

In yet another aspect of the present invention, the buried insulator layer is approximately 1600 Å below the semiconductor wafer surface and is approximately 4000 Å thick.

An important technical advantage of the present invention is the improved operating characteristics of the devices and circuits built on the SOI structure because of the elimination of the silicon inclusions in the buried insulator or silicon oxide layer.

BRIEF DESCRIPTION OF THE DRAWINGS

For a better understanding of the present invention, reference may be made to the accompanying drawings, in which.

DETAILED DESCRIPTION OF THE INVENTION

Figure 1:
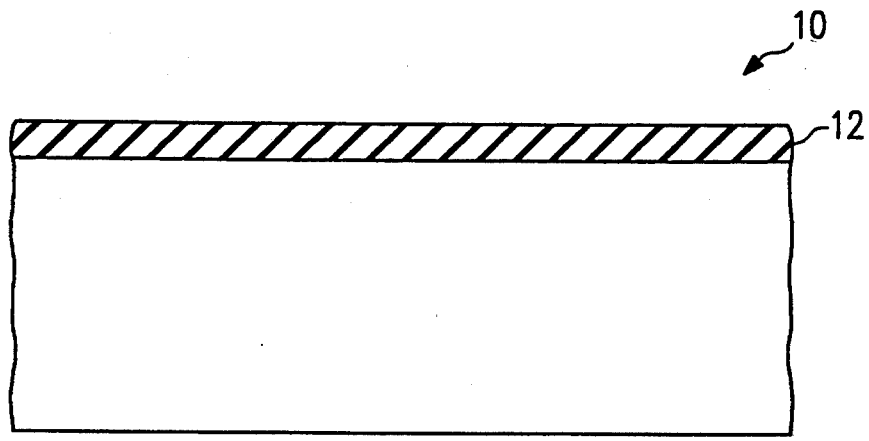
FIG. 1 is a cross-sectional view of a wafer in a first step of fabrication.
Figure 2:
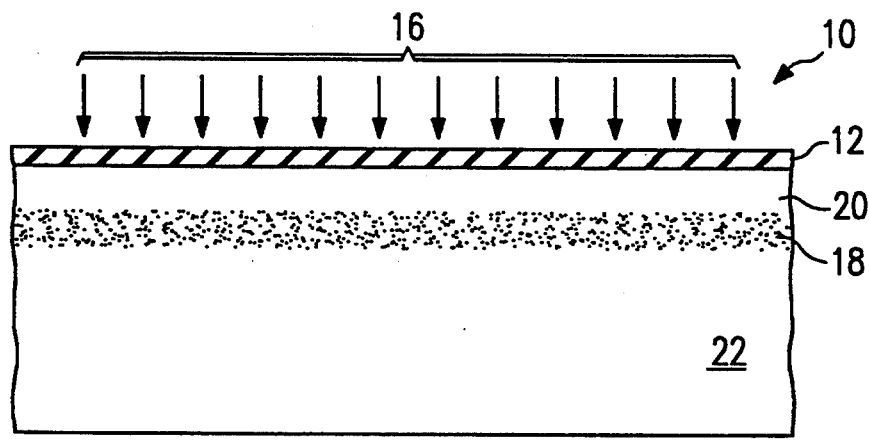
FIG. 2 is a cross-sectional view of a wafer in a second step of fabrication.
Figure 3:
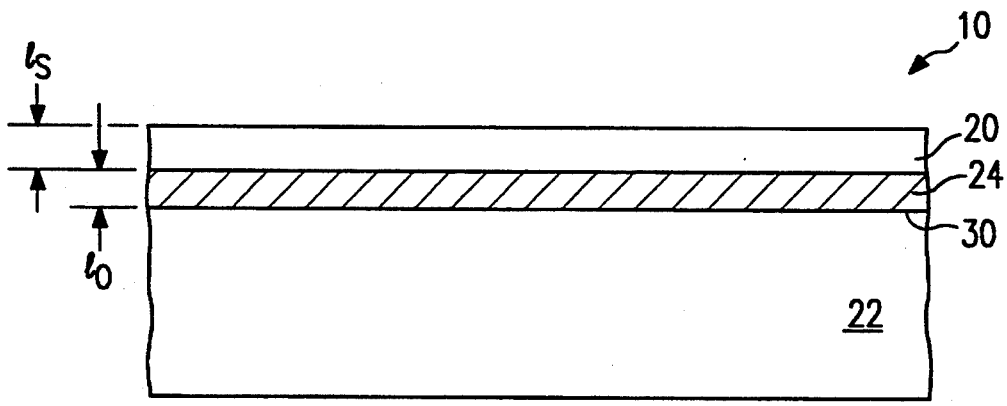
FIG. 3 is a cross-sectional view of a wafer having an SOI structure fabricated in accordance with the teachings of the present invention.

The preferred embodiment of the present invention and its advantages are best understood by referring to FIGS. 1–3 of the drawings, like numerals being used for like and corresponding parts of the various drawings. With reference to the drawings, FIG. 1 is a cross-sectional view of a wafer 10 in a first step of fabrication in accordance with the teaching of the present invention. The views shown in the drawing figures are not to scale, and certain dimensions may have been greatly exaggerated or diminished for clarity. The wafer 10 is typically a silicon wafer having conventional dimensions. A sacrificial layer 12 of a predetermined thickness is formed on top of the wafer 10. The material and thickness of the sacrificial layer 12 is determined by the purpose it serves during the fabrication process and can be best described below in conjunction with FIG. 2.

As shown in FIG. 2, the top surface of the wafer 10 is subjected to bombardment by accelerated ions 16 in an implantation step. Typical ion implantation parameters in a SIMOX (Separation by IMplanted OXygen) process may be used. For example, for oxygen ion implantation, energy of 200 keV, beam current of 40 mA and a dosage of $1.8 \times 10^{18}$ cm$^{-2}$ are typical implantation parameters. Nitrogen ions may also be used for this purpose to form a buried silicon nitride layer. Additionally, surface wafer temperatures are maintained at approximately 600° C. or higher to minimize surface silicon dislocations. The implant process generally takes six hours in which ions become embedded at a predetermined depth below the silicon wafer surface. The depth of implanted ions is determined by the energy of the implant and the remaining thickness of the sacrificial layer 12.

As the ions 16 hit the top surface of the sacrificial layer 12, the sacrificial layer 12 is gradually sputtered away by the impact. Therefore, the thickness of the sacrificial layer 12 gradually decreases until the implant process is near completion. The gradual decrease in the sacrificial layer 12 thickness causes the peak concentration of implanted ions 18 to be nearly constantly spaced from the top surface of wafer 10. In other words, the depth of the implanted ions 18 remains substantially constant though the top surface of wafer 10 is pushed outward due to the volume of the implanted ions 18. In effect, the gradual thinning of the sacrificial layer 12 substantially compensates for the gradual outgrowth of the wafer top surface. The implanted ions 18 separates the wafer 10 into a surface silicon layer 20 and a bulk silicon layer 22.

In the preferred embodiment of the present invention, the sacrificial layer 12 is a thermally grown silicon oxide layer of 1400 Å. However, the material and thickness of the sacrificial layer 12 is only limited by two requirements. First, the sacrificial layer 12 material and thickness must be such that only a gradual thinning takes place during implantation, so that it requires substantially the entire implant duration to completely or nearly completely sputter away the sacrificial layer 12. Therefore, the thickness of sacrificial layer 12 is dependent on estimated sputter rates with the given implantation parameters. A thickness of 1200–1500 Å has been shown to be adequate when the implant procedure is performed with the above enumerated parameters.

Second, the material comprising the sacrificial layer 12 must not be capable of contaminating the wafer 12. For example, silicon oxide, silicon nitride, polycrystalline silicon, and other materials may be suitable for this purpose. In addition, the sacrificial layer 12 may be formed by deposition, thermal growth or any other suitable fabrication methods.

Referring to FIG. 3, wafer 10 is shown after an annealing process performed subsequent to the implantation process. Normally, a protective oxide layer (not shown) of suitable thickness is deposited on the wafer surface prior to annealing. Post-implant anneal is performed in a neutral ambient, for example nitrogen, or preferably, Argon with 1% oxygen for approximately 3–5 hours. The anneal temperature is approximately 1325° C., but may vary according to materials requirements. During anneal, excess oxygen in the surface silicon 20 is allowed to diffuse out of the silicon, and a continuous buried layer of stoichiometric oxide layer 24 is formed by reaction of the implanted oxygen ions 18 with the silicon.

The resulting SOI structure is the surface silicon 20 of approximately 1600–2000 Å thick ($l_s$), and a buried insulating layer of approximately 4000 Å thick ($l_o$) suitable for high voltage and high radiation applications. In a typical SIMOX process, at the conclusion of the implantation process, fingers of unconverted silicon can be found extending from the bulk silicon 22 into the implanted ion regions 18. The anneal process subsequently causes these silicon fingers to form tiny silicon islands or inclusions in the buried oxide layer 24 near the interface 30 between layer 24 and the bulk silicon 22. The present invention provides a method for constructing an SOI structure that is free of these silicon inclusions at the interface 30 and thereby eliminates problems and disadvantages associated therewith.

Although the present invention has been described in detail, it should be understood that various changes, substitutions and alterations can be made thereto without departing from the spirit and scope of the present invention as defined by the appended claims.

What is claimed is:

1. A method for constructing a semiconductor-on-insulator, comprising the steps of:
    forming a sacrificial layer having a predetermined thickness on a surface of a semiconductor wafer;
    implanting ions of a predetermined dosage into said semiconductor wafer at predetermined depths below said semiconductor wafer surface wherein said ions are implanted through the entire surface of the sacrificial layer and the semiconductor wafer where the semiconductor-on-insulator is formed, which sacrificial layer and semiconductor wafer are unmasked, said sacrificial layer being gradually sputtered away by said ions; and
    annealing said semiconductor wafer at a predetermined temperature.

2. The method, as set forth in claim 1, further comprising the step of forming a protective layer on said semiconductor wafer surface before said annealing step.

3. The method, as set forth in claim 2, wherein said protective layer forming step includes depositing an oxide layer on said semiconductor wafer surface.

4. The method, as set forth in claim 1, wherein said sacrificial layer forming step includes growing a silicon oxide layer on said semiconductor wafer surface.

5. The method, as set forth in claim 1, wherein said sacrificial layer forming step includes growing an oxide film approximately 1200–1500 Å thick on said semiconductor wafer surface.

6. The method, as set forth in claim 1, wherein said sacrificial layer forming step includes forming a film having a thickness and material properties so that a substantial portion of said film is sputtered away during said implantation step.

7. The method, as set forth in claim 1, wherein said sacrificial layer forming step includes growing a silicon nitride layer.

8. The method, as set forth in claim 1, wherein said ion implanting step includes implanting oxygen ions having a dosage of approximately $1.8 \times 10^{18}$ cm$^{-2}$ into said sacrificial layer, and implanting said oxygen ions at approximately 1600–5600 Å below said semiconductor wafer surface.

9. The method, as set forth in claim 8, wherein said ion implanting step further includes implanting nitrogen ions.

10. The method, as set forth in claim 1, further comprising the step of heating said semiconductor wafer to a surface temperature of about 600° C. during said implanting step.

11. The method, as set forth in claim 1, wherein said annealing step includes heating said semiconductor wafers to at least 1100° C. in a neutral ambient gas.

12. A method for constructing semiconductor-on-insulator, comprising the steps of:

forming a sacrificial layer having a predetermined thickness on a surface of a semiconductor wafer;

implanting ions of a predetermined dosage into said semiconductor wafer at predetermined depths below said semiconductor wafer surface, wherein said ions are implanted through the entire surface of the sacrificial layer and the semiconductor wafer where the semiconductor-on-insulator is to be formed, which sacrificial layer and semiconductor wafer are unmasked, the depth of implantation remaining substantially constant due to a gradual decrease in thickness in said sacrificial layer caused by sputtering by said ions; and annealing said semiconductor wafer at high temperature in a neutral ambient atmosphere.

* * * * *